US012248248B2

(12) United States Patent
Mei et al.

(10) Patent No.: US 12,248,248 B2
(45) Date of Patent: Mar. 11, 2025

(54) ELECTRON BEAM LITHOGRAPHY WITH A BILAYER RESIST

(71) Applicant: The Boeing Company, Chicago, IL (US)

(72) Inventors: Antonio Mei, Malibu, CA (US); Ivan Milosavljevic, Thousand Oaks, CA (US); Amanda Simpson, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 617 days.

(21) Appl. No.: 17/452,198

(22) Filed: Oct. 25, 2021

(65) Prior Publication Data

US 2022/0137510 A1    May 5, 2022

Related U.S. Application Data

(60) Provisional application No. 63/110,284, filed on Nov. 5, 2020.

(51) Int. Cl.
| G03F 7/038 | (2006.01) |
| G03F 7/004 | (2006.01) |
| G03F 7/075 | (2006.01) |
| G03F 7/20  | (2006.01) |
| G03F 7/32  | (2006.01) |

(52) U.S. Cl.
CPC .......... *G03F 7/0382* (2013.01); *G03F 7/0041* (2013.01); *G03F 7/0757* (2013.01); *G03F 7/2004* (2013.01); *G03F 7/32* (2013.01)

(58) Field of Classification Search
None
See application file for complete search history.

(56) References Cited

U.S. PATENT DOCUMENTS

2014/0134524 A1* 5/2014 Hobbs ................. H01L 21/3081
430/296
2014/0191375 A1* 7/2014 Hartley ................ G03F 7/0755
257/632

OTHER PUBLICATIONS

Westly et al ("Improved time dependent performance of hydrogen silsesquioxane resist using a spin on top coat", Journal of Vacuum Science and Technology Part B, vol. 29, No. 6, Nov. 1, 2011 (Nov. 1, 2011), pp. 6FJ02-6FJ02, XP012154969) (Year: 2011).*

(Continued)

*Primary Examiner* — Sean M DeGuire
*Assistant Examiner* — Andrew Preston Traywick
(74) *Attorney, Agent, or Firm* — Yee & Associates, P.C.

(57) ABSTRACT

A method, apparatus, and system for processing a material stack. A hydrogen silsesquioxane layer is deposited on the material stack. A diffusion barrier layer is deposited on the hydrogen silsesquioxane layer to form a bilayer. The diffusion barrier layer comprises a material having a thickness that increases an amount of time before the hydrogen silsesquioxane layer ages to change a dose in an electron beam needed to expose the hydrogen silsesquioxane layer for a selected feature geometry with a desired width. The electron beam is directed through a surface of the bilayer to form an exposed portion of the bilayer. The electron beam applies the dose that is selected based on a pattern density of features for the material stack to have a desired level of exposure of the hydrogen silsesquioxane layer for the selected feature geometry. The hydrogen silsesquioxane layer is developed. The exposed portion remains on material stack.

24 Claims, 10 Drawing Sheets

(56) References Cited

OTHER PUBLICATIONS

Sookyung Choi, Michael J. Word, Vipan Kumar, Ilesanmi Adesida; Comparative study of thermally cured and electron-beam-exposed hydrogen silsesquioxane resists. J. Vac. Sci. Technol. B Sep. 1, 2008; 26 (5): 1654â1659 (Year: 2008).*

Hyung Wan Do, Jae-Byum Chang, Karl K. Berggren; Three-dimensional nanofabrication using hydrogen silsesquioxane/poly(methylmethacrylate) bilayer resists. J. Vac. Sci. Technol. B Nov. 1, 2014; 32 (6): 06F501. (Year: 2014).*

Marcus Rommel, JÃ¼rgen Weis; Hydrogen silsesquioxane bilayer resistsâCombining high resolution electron beam lithography and gentle resist removal. J. Vac. Sci. Technol. B Nov. 1, 2013; 31 (6): 06F102 (Year: 2013).*

Westly et al., "Improved time dependent performance of hydrogen silsesquioxane resist using a spin on top coat," Journal of Vacuum Science and Technology, vol. 29, No. 6, Nov. 1, 2022, paper 06FJ02, 7 pages.

Sundaram et al., "An easy method to perform e-beam negative tone lift-off fabrication on dielectric material with sandwiched conducting polymer layer," Journal of Micromechanics and Microengineering, vol. 21, No. 6, May 11, 2011, 8 pages.

Extended European Search Report (EESR) dated Mar. 14 2022, regarding U.S. Appl. No. 21/204,563, 9 pages.

Bickford et al., Hydrogen silsesquioxane on SOI proximity and microloading effects correction from a single 1D characterization sample, Journal of Vacuum Science & Technology B, Nov. 12, 2014, vol. 32, No. 6, 7 pages.

Chang, Proximity effect in electron-beam lithography, Journal of Vacuum Science and Technology, 1975, vol. 12, No. 6, pp. 1271-1275.

Clark et al., Time-dependent exposure dose of hydrogen silsesquioxane when used as a negative electron-beam esist, Journal of Vacuum Science & Technology B: Microelectronics and Nanometer Structures Processing, Measurement, and Phenomena, Nov. 30, 2006, vol. 24, No. 6, pp. 3073-3076.

Grove, A patterning process utilizing a nanoimprint lithography for fabrication of planar perpendicular patterned magnetic media, Rowan University, 2005, Thesis, available at https://rdw.rowan.edu/etd/1005?utm_source=rdw.rowan.edu%2Fetd%2F1005&utm_medium=PDF&utm_campaign=PDFCoverPages, last accessed on Dec. 21, 2022, 85 pages.

Henschel et al., Study of a high contrast process for hydrogen silsesquioxane as a negative tone electron beam resist, Journal of Vacuum Science & Technology B: Microelectronics and Nanometer Structures Processing, Measurement, and Phenomena, Sep. 12, 2003, vol. 21, No. 5, pp. 2018-2025.

Lee et al., Two-step resist-development process of hydrogen silsesquioxane for high-density electron-beam hanopatterning, Journal of Vacuum Science & Technology B: Microelectronics and Nanometer Structures Processing, Measurement, and Phenomena, Feb. 4, 2009, vol. 27, No. 1, pp. 188-192.

Loboda et al., Understanding hydrogen silsesquioxane-based dielectric film processing, Solid State Technology, May 1998, 4 pages.

Lopez et al., Isofocal dose based proximity effect correction tolerance to the effective process blur, J. Vac. Sci. Technol. B 35, Nov. 21, 2017, vol. 35, No. 6, 8 pages.

Murai et al., Fast proximity effect correction method using a pattern area density map, Journal of Vacuum Science & Technology B: Microelectronics and Nanometer Structures Processing, Measurement, and Phenomena, Jun. 4, 1998, vol. 10, No. 6, pp. 3072-3076.

Olynick et al., Electron-beam exposure mechanisms in hydrogen silsesquioxane investigated by vibrational spectroscopy and in situ electron-beam-induced desorption, J. Vac. Sci. Technol. B 28, May 17, 2010, vol. 28, No. 3, pp. 581-587.

Olynick et al., Scanning x-ray microscopy investigations into the electron-beam exposure mechanism of hydrogen silsesquioxane resists, J. Vac. Sci. Technol. B 24, Nov. 30, 2006, vol. 24, No. 6, pp. 3048-3054.

Piramanayagam et al., Path to achieve sub-10-nm half-pitch using electron beam lithography, Journal of Vacuum Science & Technology B, Jan. 28, 2011, vol. 29, No. 1, 8 pages.

Sidorkin et al., Method for improving the aspect ratio of ultrahigh-resolution structures in negative electron-beam resist, J. Vac. Sci. Technol. B 27, Dec. 1, 2009, vol. 27, No. 6, pp. 2503, 2507.

Sidorkin et al., Resist thickness effects on ultra thin HSQ patterning capabilities, Science Direct: Microelectronic Engineering, vol. 86, No. 4-6, Jan. 3, 2009, pp. 749-751.

Siew et al., Thermal Curing of Hydrogen Silsesquioxane, Journal of The Electrochemical Society, May 1999, vol. 147, No. 1, pp. 335-339.

Tracer, GenISys, 2020, available at: https://www.genisys-gmbh.com/tracer.html, last accessed on Dec. 21, 2022, 4 pages.

Vandelft, Delay-time and aging effects on contrast and sensitivity of hydrogen silsesquioxane, Journal of Vacuum Science & Technology B: Microelectronics and Nanometer Structures Processing, Measurement, and Phenomena, Dec. 9, 2002, vol. 20, No. 6, pp. 2932-2936.

Yang et al., Understanding of hydrogen silsesquioxane electron resist for sub-5-nm-half-pitch lithography, Journal of Vacuum Science & Technology B: Microelectronics and Nanometer Structures Processing, Measurement, and Phenomena, Dec. 2, 2009, vol. 27, No. 6, pp. 2622-2627.

Yu et al., Study of spin-coated resist coverage on nanoscale topography using spectroscopic ellipsometry, J. Appl, Phys., Jul. 5, 2011, vol. 110, No. 1, 6 pages.

Zeng et al., Effectiveness of Ti, TiN, Ta, TaN, and W2N as barriers for the integration of low-k dielectric hydrogen silsesquioxane, Journal of Vacuum Science & Technology B: Microelectronics and Nanometer Structures Processing, Measurement, and Phenomena, Feb. 9, 2000, vol. 18, No. 1, pp. 221-230.

Canadian Intellectual Property Office Search Report, dated Feb. 9, 2024, regarding Application No. CA3130856, 3 pages.

Espacer 300Z, Safety Data Sheet, prepared Aug. 23, 2003, 5 pages.

Amaya et al., "Conductivity of poly(2-methoxyaniline-5-phosphonic acid)/aminecomplex and its charge dissipation property in electron beam lithography," Synthetic Metals 198, 2014, pp. 88-92.

* cited by examiner

FIG. 10

| $D\,[mC/cm^2]$ | 19 | 22 | 30 | 37 | 44 | 51 | 55 |
|---|---|---|---|---|---|---|---|
| 1.30 | 62 | 0 | 0 | 0 | 0 | 0 | 0 |
| 1.25 | 75 | 14 | 0 | 0 | 0 | 0 | 0 |
| 1.20 | 100 | 29 | 0 | 0 | 0 | 0 | 0 |
| 1.10 | 100 | 71 | 0 | 0 | 0 | 0 | 0 |
| 1.05 | 100 | 100 | 0 | 0 | 0 | 0 | 0 |
| 1.00 | 100 | 100 | 0 | 0 | 0 | 0 | 0 |
| 0.95 | 100 | 100 | 57 | 0 | 0 | 0 | 0 |
| 0.90 | 100 | 100 | 100 | 38 | 0 | 0 | 0 |
| 0.85 | 100 | 100 | 100 | 25 | 0 | 0 | 0 |
| 0.80 | 100 | 100 | 100 | 75 | 0 | 0 | 0 |
| 0.75 | 100 | 100 | 100 | 100 | 29 | 29 | 0 |
| 0.70 | 100 | 100 | 100 | 100 | 86 | 71 | 0 |
| 0.65 | 100 | 100 | 100 | 100 | 100 | 43 | 38 |
| 0.60 | 100 | 100 | 100 | 100 | 100 | 100 | 88 |
| 0.55 | 100 | 100 | 100 | 100 | 100 | 100 | 100 |
| 0.50 | 100 | 100 | 100 | 100 | 100 | 100 | 100 |

$\rho\,[\%]$

ELECTRON BEAM LITHOGRAPHY WITH A BILAYER RESIST

RELATED PROVISIONAL APPLICATION

This application is related to and claims the benefit of priority of provisional U.S. Patent Application Ser. No. 63/110,284, entitled "Electron Beam Lithography With a Bilayer Resist", filed on Nov. 5, 2020, which is hereby incorporated by reference.

BACKGROUND INFORMATION

1. Field

The present disclosure relates generally to semiconductors and, in particular, to a method for forming semiconductor structures for quantum applications using electron beam lithography with a bilayer resist system.

2. Background

Multistep processes are employed to fabricate semiconductor and quantum devices. These processes include a sequence of lithography and chemical processing steps during which circuits and quantum devices can be created on a wafer. Integrated circuits can be fabricated such that millions of electrical or quantum components can be present in an area of about one centimeter. With respect to quantum devices, a tight control over pattern geometries and contaminants is desirable.

With shrinking features, issues such as mask alignment, resolution, contamination, and defects become a greater concern in fabricating devices. For example, with feature widths that are 10 micrometers or less, particles present in the air during the application can add to potential contamination and increase defects.

With respect to feature sizes, electron beam lithography can be used. Electron beam lithography is a process in which a focused beam of electrons is scanned to draw shapes on a structure covered with a resist. The electron beam changes the solubility of a resist enabling selective removal of either the exposed or nonexposed regions of the resist by immersing a structure with a film in a solvent. With electron beam lithography, very small patterns such as sub-10 nanometers can be achieved.

Although electron beam lithography is a useful technology that can enable the patterning of features below 10 nanometer dimensions, other issues are still present with a reduction in size of the features. Contamination and electron scattering within the resist and from the substrate are examples of other concerns that increase as the size of the features decreases. With scattering, a proximity effect occurs in which a scattering of electrons within the resist and the scattering of electrons from the substrate are such that undesired exposures of the resist occurs in regions adjacent to the intended exposure by the electron beam. As the size of the features decrease, issues with undesired exposures caused by a proximity effect increase.

Therefore, it would be desirable to have a method and apparatus that take into account at least some of the issues discussed above, as well as other possible issues. For example, it would be desirable to have a method and apparatus that overcome a technical problem with electron beam lithography used in manufacturing devices.

SUMMARY

An embodiment of the present disclosure provides a method for processing a material stack. A hydrogen silsesquioxane layer is deposited on the material stack. An aluminum layer is deposited on the hydrogen silsesquioxane layer to form a bilayer. An electron beam is directed through a surface of the bilayer to form an exposed portion of the bilayer. The bilayer is developed with tetramethylammonium hydroxide, wherein the tetramethylammonium hydroxide removes the aluminum layer and an unexposed portion of the hydrogen silsesquioxane layer, leaving the exposed portion of the hydrogen silsesquioxane layer on the material stack.

Another embodiment of the present disclosure provides a method for processing a material stack. A hydrogen silsesquioxane layer is deposited on the material stack. A diffusion barrier layer is deposited on the hydrogen silsesquioxane layer to form a bilayer. The diffusion barrier layer is comprised of a material having a thickness that increases an amount of time before the hydrogen silsesquioxane layer ages to change a dose in an electron beam needed to expose the hydrogen silsesquioxane layer to obtain a desired width for a selected feature geometry. The electron beam is directed through a surface of the bilayer to form an exposed portion of the bilayer. The electron beam applies the dose in the exposed portion of the bilayer that is selected based on a pattern density of features for the material stack to have a desired level of exposure of the hydrogen silsesquioxane layer for the selected feature geometry. The hydrogen silsesquioxane layer is developed. The exposed portion of the hydrogen silsesquioxane layer exposed to the electron beam remains on the material stack.

Yet another embodiment of the present disclosure provides a product management system comprising fabrication equipment and a control system. The control system is configured to control the fabrication equipment to deposit a hydrogen silsesquioxane layer on a material stack; deposit a diffusion barrier layer on the hydrogen silsesquioxane layer to form a bilayer, wherein the diffusion barrier layer is comprised of a material having a thickness that increases an amount of time before the hydrogen silsesquioxane layer ages to change a dose in an electron beam needed to expose the hydrogen silsesquioxane layer for a desired width a selected feature geometry; direct an electron beam through a surface of the bilayer to form an exposed portion of the bilayer, wherein the electron beam applies the dose in the exposed portion of the bilayer that is selected based on a pattern density of features for the material stack to have a desired level of exposure of the hydrogen silsesquioxane layer for the selected feature geometry; and develop the hydrogen silsesquioxane layer wherein the exposed portion of the hydrogen silsesquioxane layer exposed to the electron beam remains on the material stack.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 10 is an illustration of a graph of exposures of devices as a function dose and pattern density without proximity effect corrections in accordance with an illustrative embodiment;

DETAILED DESCRIPTION

Figure 1:
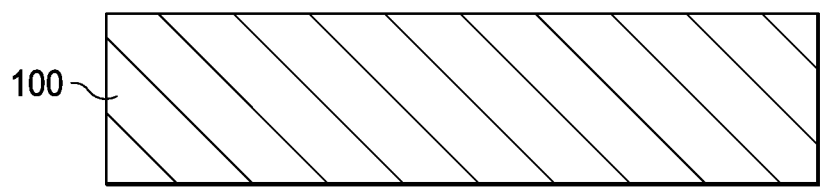
FIG. 1 is illustration of a cross-sectional view of a material stack in accordance with an illustrative embodiment.

The illustrative embodiments recognize and take into account one or more different considerations. For example, the illustrative embodiments recognize and take into account that electron beam lithography can be performed using hydrogen silsesquioxane (HSQ) and sodium containing developers to pattern sub-10 nm resolution features. The illustrative embodiments recognize and take into account that sodium-based developers are a mobile contaminant that is incompatible with many electronic devices and quantum devices.

The illustrative embodiments recognize and take into account that hydrogen silsesquioxane has a chemical instability that causes exposure characteristics to change over time. The illustrative embodiments recognize and take into account that hydrogen silsesquioxane is an intrinsically unstable compound. The illustrative embodiments recognize and take into account that the instability stems from highly mobile and reactive hydrogen species, which reside on the vertices of the cuboid silsesquioxane structure. The illustrative embodiments recognize and take into account that exposure to energy in the form of heat, electrons, or ultraviolet photons triggers the release of hydrogen as radicals. The illustrative embodiments recognize and take into account that the radicals diffuse catalyzing redistribution reactions which crosslink neighboring molecules into base-insoluble hydrogen-enriched SiOx oligomers. The illustrative embodiments recognize and take into account that ambient conditions are insufficiently inert to completely impede the reactions, resulting in a limited shelf life and transient exposure behaviors.

The illustrative embodiments recognize and take into account that the dose of an electron beam needed to expose a film of hydrogen silsesquioxane can change over time as hydrogen silsesquioxane ages after being applied to a wafer, a substrate, a film, or some other material. The illustrative embodiments recognize and take into account that this instability can reduce the control of dimensions for devices being manufactured. Further, the illustrative embodiments recognize and take into account that narrow process margins can occur in which time for exposure and development of a hydrogen silsesquioxane film to obtain desired results may be much narrower than desired. The illustrative embodiments also recognize and take into account that a proximity effect can have varied issues as the pattern density changes. The illustrative embodiments recognize and take into account that the pattern density is a density of features.

In other words, the illustrative embodiments recognize and take into account that the dose applied using an electron beam may be sufficient one time to change the solubility of hydrogen silsesquioxane but may be insufficient at a later time.

Thus, the illustrative examples provide a method, apparatus, and system for manufacturing a structure using electron beam lithography with a bilayer resist system. In one illustrative example, a hydrogen silsesquioxane layer is deposited on a material stack. A diffusion barrier layer is deposited on the hydrogen silsesquioxane layer to form a bilayer. The diffusion barrier layer is comprised of a material having a thickness that increases an amount of time before the hydrogen silsesquioxane layer ages to change a dose in an electron beam needed to expose the hydrogen silsesquioxane layer for a selected feature geometry with a desired width. The electron beam is directed through a surface of the bilayer to form an exposed portion of the bilayer. The electron beam applies the dose in the exposed portion of the bilayer that is selected based on a pattern density of features for the material stack to have a desired level of exposure of the hydrogen silsesquioxane layer for the selected feature geometry. The hydrogen silsesquioxane layer is developed. The exposed portion of the hydrogen silsesquioxane layer exposed to the electron beam remains on the material stack.

Example embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive.

Further, the figures are not necessarily to scale, as some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper," "lower," "right," "left," "vertical," "horizontal," "top," "bottom," and derivatives thereof shall relate to the illustrative examples in the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element.

In this disclosure, when an element, such as a layer, a region, or a substrate, is referred to as being "on" or "over" another element, the element can be directly on the other element or intervening elements can also be present. In contrast, when an element is referred to as being "directly on," "directly over," or "on and in direct contact with" another element, no intervening elements are present, and the element is in contact with the other element.

The processes, steps, and structures described below do not form a complete process flow for manufacturing integrated circuits. The disclosure can be practiced in conjunction with integrated circuit fabrication techniques currently used in the art, and only so much of the commonly practiced process steps are included as necessary for an understanding of the different examples of the present disclosure. The figures represent cross-sections of a portion of an integrated circuit during fabrication and are not drawn to scale, but instead are drawn so as to illustrate different illustrative features of the disclosure.

With reference now to FIGS. 1-7, illustrations of cross-sections in a process to form a semiconductor structure are depicted in accordance with an illustrative embodiment. These cross-sections are illustrated to show various steps in processing a material stack and are not inclusive of all the steps that may be used. Other steps may be omitted to avoid obscuring a description of features for electron beam lithography using a bilayer resist system.

In FIG. 1, an illustration of a cross-sectional view of a material stack is depicted in accordance with an illustrative embodiment. In this illustrative example, material stack 100 can take a number of different forms. For example, material stack 100 can be at least one of a wafer or a set of layers. Wafers can take various forms. For example, a wafer can be a silicon wafer, a silicon carbide wafer, or some other type of wafer.

As used herein, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

As used herein, a "set of," when used with reference to items, means one or more items. For example, a "set of layers" is one or more layers.

A wafer can also be referred to as a slice or a substrate. A wafer can be a thin slice of semiconductor or some other material that is used to fabricate integrated circuits, solar cells, quantum bits, quantum memories, or other devices. A layer is a thickness for a film comprised of the material that is to be processed in forming a device. For example, the layer can be a thin film which is a layer of material ranging from fractions of a nanometer to several micrometers in thickness.

In this illustrative example, prior processing and etching is not shown for material stack 100. In other illustrative examples, the process can be applied after other etching or processing steps for material stack 100.

Figure 2:
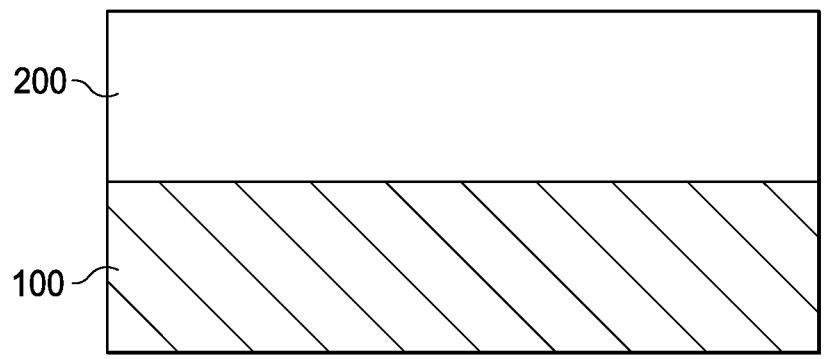
FIG. 2 is an illustration of a cross-sectional view of a material stack with a hydrogen silsesquioxane layer in accordance with an illustrative embodiment.

Turning next to FIG. 2, an illustration of a cross-sectional view of a material stack with a hydrogen silsesquioxane layer is depicted in accordance with an illustrative embodiment. In this illustrative example, hydrogen silsesquioxane layer 200 has been deposited on material stack 100.

The deposition of hydrogen silsesquioxane to form hydrogen silsesquioxane layer 200 can be performed through various semiconductor techniques including spin coating. Spin coating can be used to apply films on substrates such as material stack 100. Hydrogen silsesquioxane layer 200 is a thin film layer that can be useful for fabricating quantum devices and semiconductors including quantum bits for a quantum memory.

In this illustrative example, the thickness of hydrogen silsesquioxane layer 200 can vary depending on the particular implementation. In one illustrative example, the thickness of hydrogen silsesquioxane layer 200 can be from about 20 nm to about 100 nm.

Figure 3:
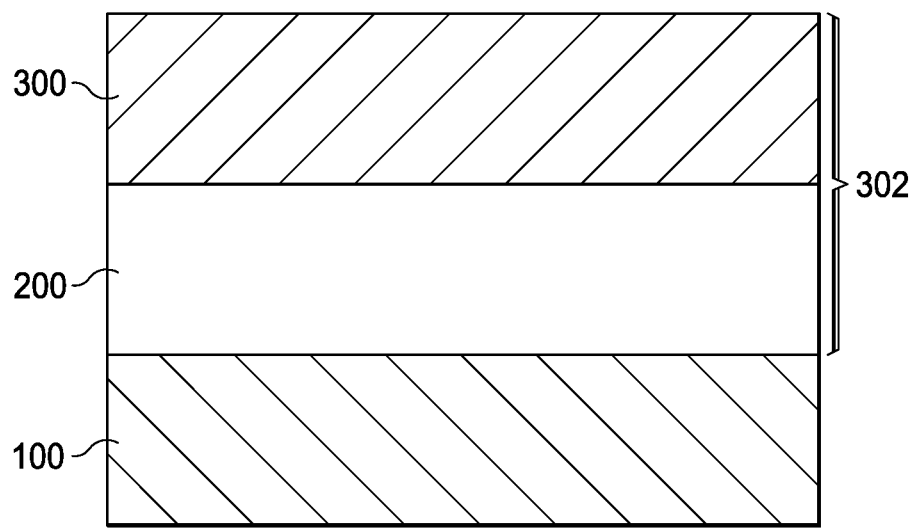
FIG. 3 is an illustration of a cross-sectional view of a bilayer on a material stack in accordance with an illustrative embodiment.

With reference next to FIG. 3, an illustration of a cross-sectional view of a bilayer on a material stack is depicted in accordance with an illustrative embodiment. As depicted, diffusion barrier layer 300 has been deposited on hydrogen silsesquioxane layer 200 to form bilayer 302. Bilayer 302 can also be referred to as a bilayer resist.

In this illustrative example, diffusion barrier layer 300 can be comprised of one or more materials. The particular material selected can be based on reducing at least one of contaminants for aging of hydrogen silsesquioxane layer 200. For example, at least one of the material or thickness of diffusion barrier layer 300 can be selected to reduce or prevent contaminants from entering hydrogen silsesquioxane layer 200.

Additionally, diffusion barrier layer 300 can also be selected such that aging of hydrogen silsesquioxane layer 200 is reduced. In other words, the aging can be slowed down such that a longer period of time is available before hydrogen silsesquioxane layer 200 ages to change a dose in an electron beam needed to expose hydrogen silsesquioxane layer 200 to obtain a desired width for a selected feature geometry. For example, the period of time from which hydrogen silsesquioxane layer 200 is formed until the time hydrogen silsesquioxane layer 200 ages such that a width can increase to an undesired value can be shorter than desired without diffusion barrier layer 300. For example, the times can be (1) performing exposure within four hours and (2) completing the developing process within 20 hours of forming hydrogen silsesquioxane layer 200 without diffusion barrier layer 300.

With diffusion barrier layer 300, the time to perform electron beam scanning for exposure can be increased to 50 hours with a completion time for developing hydrogen silsesquioxane layer 200 to 250 hours. In this manner, a window of time during which processing should occur can be greater and become less critical with respect to obtaining desired results.

For example, diffusion barrier layer 300 in bilayer 302 can be selected from at least one of aluminum, aluminum oxide, titanium, or some other suitable material that can be used as a diffusion barrier In the depicted example, the material and a thickness of the material used in diffusion barrier layer 300 is selected to increase the amount of time before hydrogen silsesquioxane layer 200 ages to change a dose in an electron beam needed to expose hydrogen silsesquioxane layer 200.

Further, the mass thickness of diffusion barrier layer 300 in bilayer 302 is selected to decrease scattering of the electron beam to obtain a desired width of a selected feature geometry. The mass thickness of a material is the actual thickness of the material times the density of the material. In this illustrative example, the feature can be selected from at least one of a gate, a lead, a line, or any other geometric shape or configuration. In this illustrative example, the width can be a distance between different points on the feature. For example, the width can be from edge-to-edge, corner-to-corner, or some other reference points or locations for the selected geometry for the feature.

When a metal, such as aluminum, is used, evaporation of the aluminum can be performed to deposit the aluminum on hydrogen silsesquioxane layer 200 to form diffusion barrier layer 300 in the form of an aluminum layer.

Figure 4:
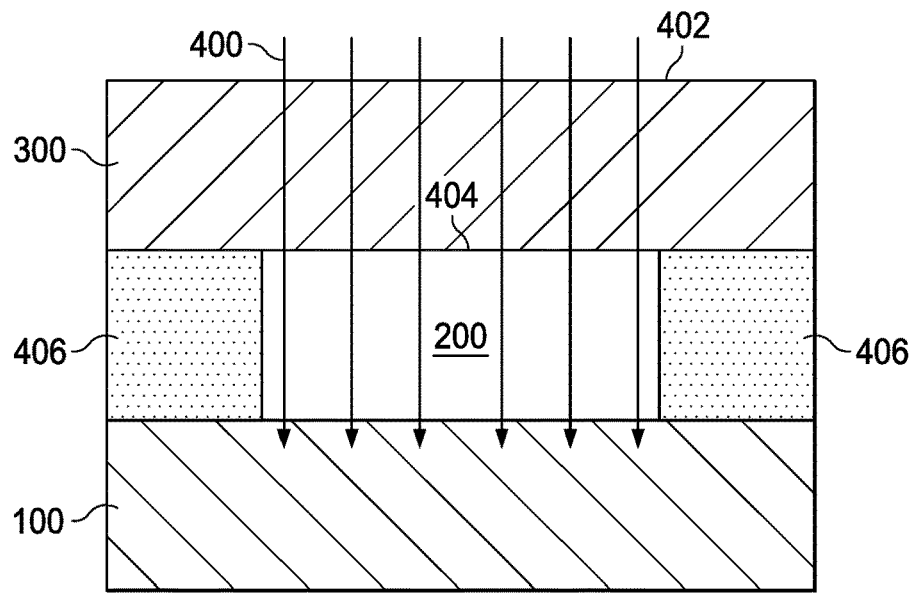
FIG. 4 is an illustration of a cross-sectional view of exposing a resist in a bilayer in accordance with an illustrative embodiment.

Turning now to FIG. 4, an illustration of a cross-sectional view of exposing a resist in a bilayer is depicted in accordance with an illustrative embodiment. In this illustrative example, electron beam 400 can be directed through surface 402 of bilayer 302 to expose portions of hydrogen silsesquioxane layer 200. As a result, hydrogen silsesquioxane layer 200 has exposed portion 404 and unexposed portion 406.

In this illustrative example, hydrogen silsesquioxane in hydrogen silsesquioxane layer 200 is a negative tone resist. With a negative tone resist, portions of hydrogen silsesquioxane in hydrogen silsesquioxane layer 200 exposed by electrons from electron beam 400 become unremovable when a developer is used to develop hydrogen silsesquioxane layer 200.

Figure 5:
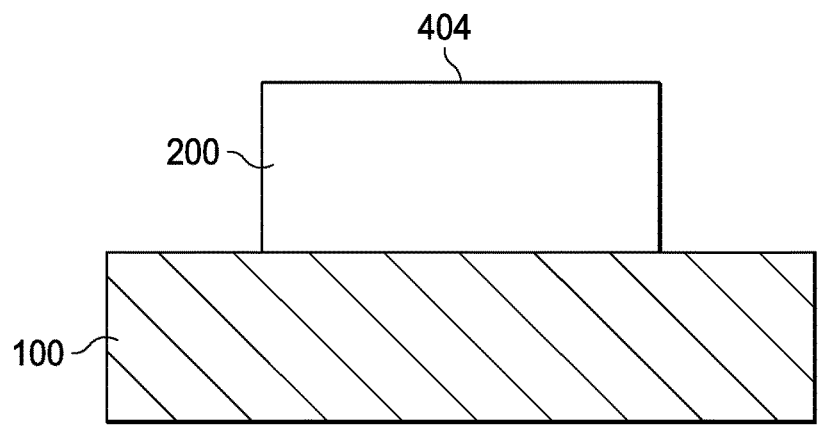
FIG. 5 is an illustration of a cross-sectional view of a material stack with an exposed portion of a hydrogen silsesquioxane layer in accordance with an illustrative embodiment.

With reference next to FIG. 5, an illustration of a cross-sectional view of a material stack with an exposed portion of a hydrogen silsesquioxane layer is depicted in accordance with an illustrative embodiment. As can be seen in this view, exposed portion 404 of hydrogen silsesquioxane layer 200 remains on material stack 100 after developing the resist, hydrogen silsesquioxane layer 200. Unexposed portion 406 in FIG. 4 of hydrogen silsesquioxane layer 200 has been removed.

In this cross-sectional view, exposed portion 404 of hydrogen silsesquioxane layer 200 remains for use in etching material stack 100.

In this illustrative example, depending on the type of developer used, diffusion barrier layer 300 may be removed prior to exposing hydrogen silsesquioxane layer 200 to a developer. The developer can be selected such that the developer removes portions of bilayer 302 including all of diffusion barrier layer 300 and unexposed portion 406 of hydrogen silsesquioxane layer 200.

For example, diffusion barrier layer 300 can be an aluminum layer, an aluminum oxide layer, or some combination thereof. With this type of material for diffusion barrier layer 300, a developer such as tetramethylammonium hydroxide can be used. In this manner, an additional step of removing diffusion barrier layer 300 prior to developing hydrogen silsesquioxane layer 200 becomes unnecessary with the selection of the appropriate developer.

Figure 6:
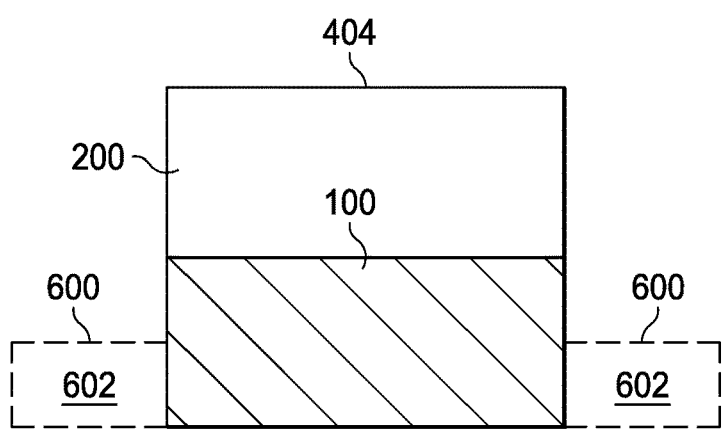
FIG. 6 is an illustration of a cross-sectional view of an etched material stack in accordance with an illustrative embodiment.

With reference to FIG. 6, an illustration of a cross-sectional view of an etched material stack is depicted in accordance with an illustrative embodiment. As depicted, material stack 100 with exposed portion 404 of hydrogen silsesquioxane layer 200 has been etched. In this example, the etching can be performed using various techniques. For example, the type of etching performed can be selected from at least one of wet etching, anisotropic etching, dry etching, plasma etching, or other suitable etching techniques.

As depicted, portions of material stack 100 not covered by exposed portion 404 of hydrogen silsesquioxane layer 200 has been removed. In this illustrative example, when material stack 100 is a set of layers, the entire set of layers is removed. In other illustrative examples, the etching can be such that only a portion of the set of layers is removed from material stack 100 as shown by regions 602 within dashed line 600. In another example, when material stack 100 is a wafer substrate, a portion of material stack 100 is removed with the remaining portion indicated by dashed line 600.

Figure 7:
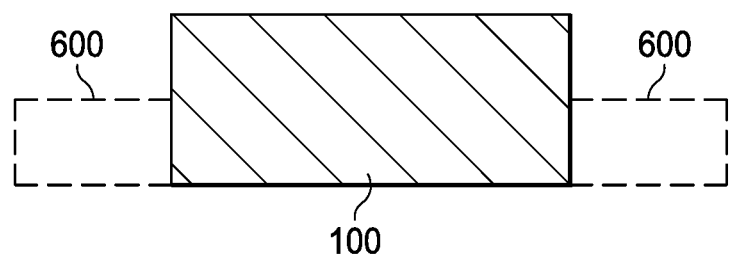
FIG. 7 is an illustration of a cross-sectional view of a material stack after etching and removal of a hydrogen silsesquioxane layer in accordance with an illustrative embodiment.

Turning now to FIG. 7, an illustration of a cross-sectional view of a material stack after etching and removal of a hydrogen silsesquioxane layer is depicted in accordance with an illustrative embodiment. As depicted in this cross-sectional view, exposed portion 404 of hydrogen silsesquioxane layer 200 has been removed. In this view, the resulting structure or geometry for material stack 100 is shown. Additional lithography in etching steps can be performed to create different features to form a set of structures from material stack 100.

For example, the set of structures formed from material stack 100 can be selected from at least one of a quantum bit, a quantum dot qubit, a waveguide, an optical waveguide, an optical resonator, a photon emitting quantum memory, a transistor, or some other suitable type of structure. In this depicted example, a quantum dot qubit is a quantum bit that uses semiconductor quantum dots.

The illustration of the cross-sectional views illustrating steps for performing electron beam lithography with a bilayer resist. Bilayer 302 in FIGS. 1-7 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, diffusion barrier layer 300 can be comprised of sub layers such as, for example, an aluminum layer and an aluminum oxide layer. As another example, additional processing steps for creating features for a set of structures from material stack 100 can be performed although not shown. The steps include other electron beam lithography steps, other etching, doping, or implantation steps to form desired features for structures using material stack 100 as a starting point or intermediate point. Additionally, material stack 100 may have been previously etched and may include cavities, doped regions, or other features not depicted in material stack 100.

Figure 8:
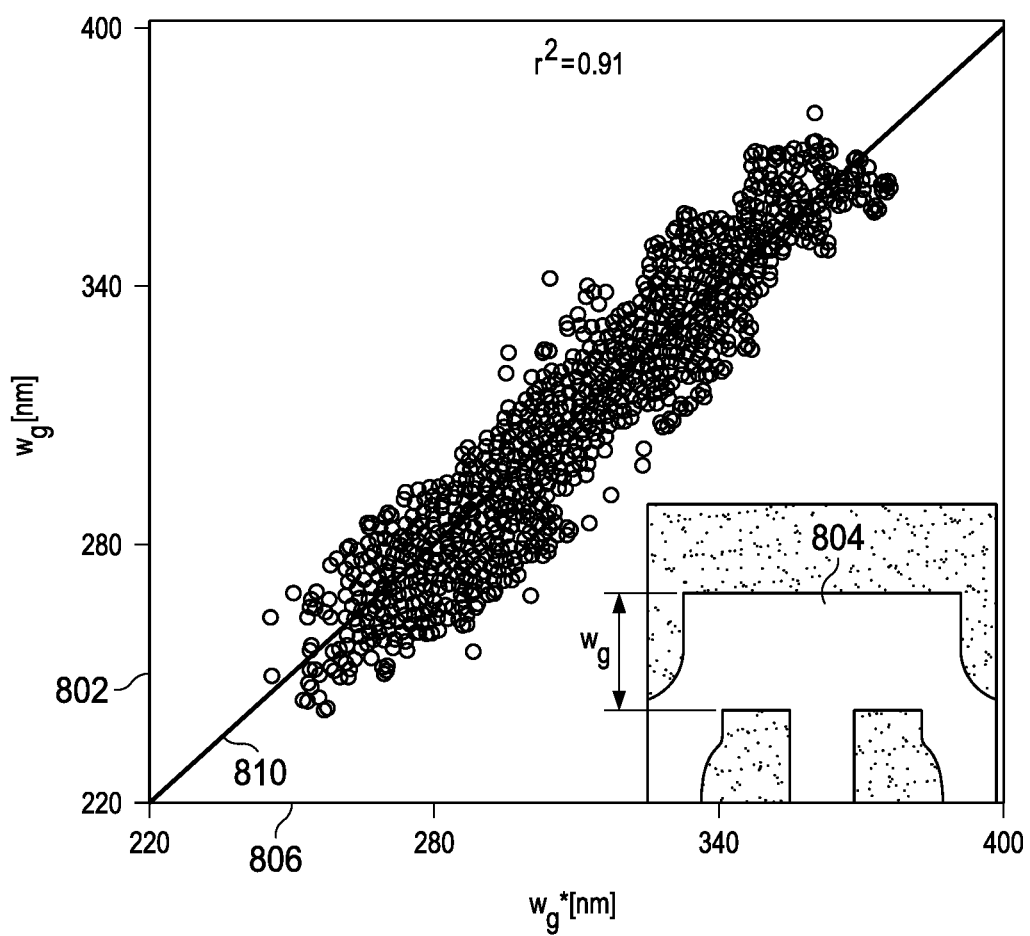
FIG. 8 is an illustration of a graph of width for a patterned structure as a function of predicted widths by a linear model in accordance with an illustrative embodiment.

Turning next to FIG. 8, an illustration of a graph of width for a patterned structure as a function of predicted widths by a linear model is depicted in accordance with an illustrative embodiment. In this illustrative example, graphic 800 is a graph of width $w_g$ in nm on y-axis 802 for patterned structured 804 as a function of predicted widths $w_g^*$ in nm on x-axis 806 for patterned structure 804.

The predicted widths are predicted by linear model based on five independent experimental variables in this illustrative example. In this example, the five independent experimental variables are exposure dose, geometry of the feature, the Al cap thickness, developer time (time exposed to the developer TMAH), and exposure delay (time between coating and exposure to the electron beam). In this example, $r^2$ is obtained from the linear regression. A larger value of $r^2$ means the model is better at describing the data. In this example, r is a Pearson correlation coefficient. As depicted, the data points along line 810 indicates how the width depends on experimental parameters in this linear model. In this graph, a geometry can be targeted when the correlation coefficients for the five independent experimental variables in this example are known. In this example, the position of an edge moves at a rate of 0.25 nm/hr/edge. As a result, patterning a 10-nm-wide gap with +/−1 nm tolerance means exposures should be performed in under four hours and be completed within 20 hours of coating. These time constraints are undesirable in many situations.

Figure 9:
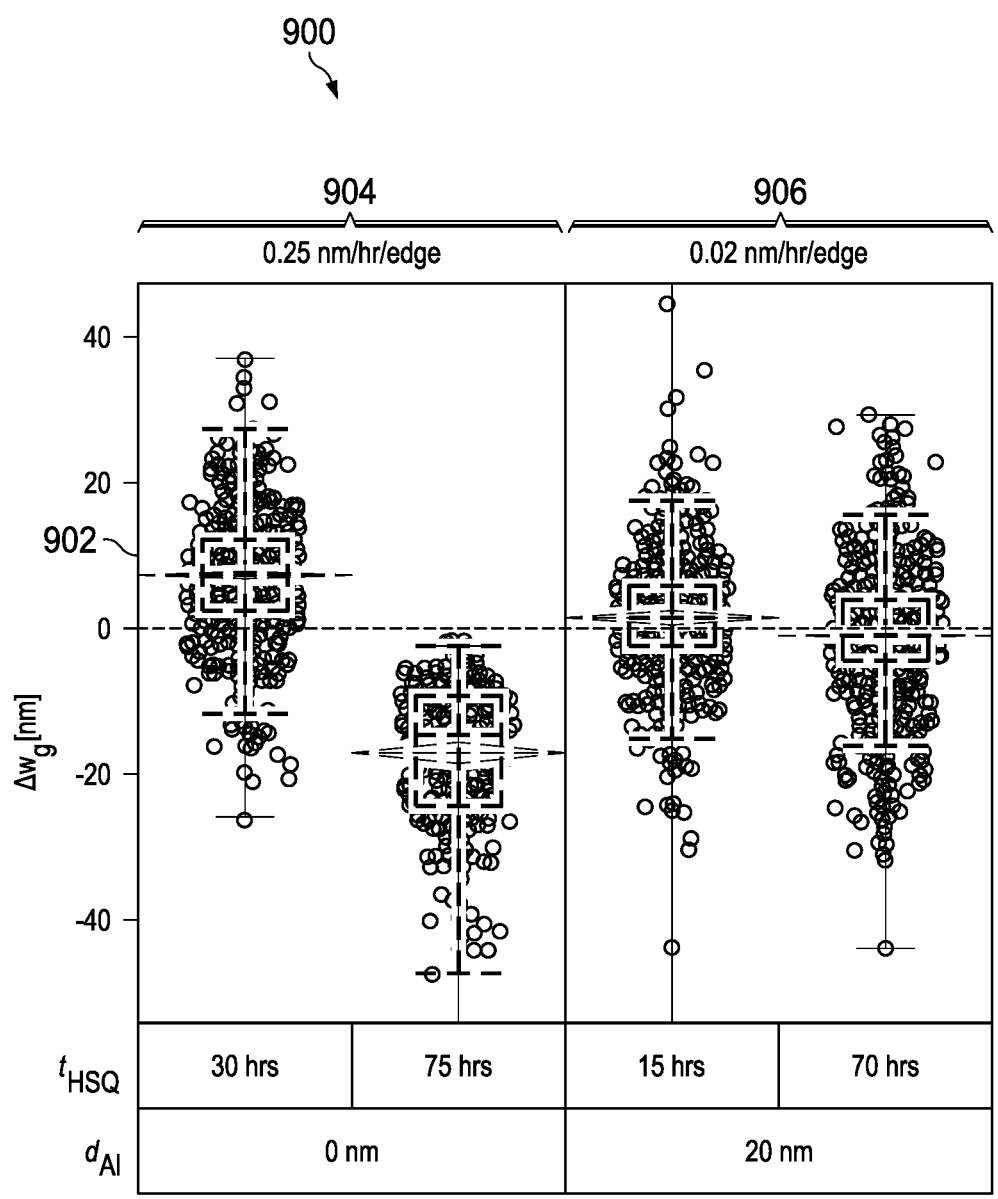
FIG. 9 is an illustration of a graph of differences between a width of a pattern structure and predicted widths in accordance with an illustrative embodiment.

With reference next to FIG. 9, an illustration of a graph of differences between a width of a pattern structure and predicted widths is depicted in accordance with an illustrative embodiment. In this illustrative example, graph 900 illustrates the difference $\Delta w_g$ between a width of the pattern structure $w_g$ in a predicted width including the effect of exposure delay on y-axis 902. Section 904 shows $\Delta w_g$ based on an exposure delay of 30 hours and 75 hours for a 0.25 nm/hr/edge without a diffusion barrier layer. Section 906 shows $\Delta w_g$ based on an exposure delay of 15 hours and 70 hours with a diffusion barrier layer comprised of aluminum that is 20 nanometers thick. In this example, 0.25 nm/hr/edge in section 904 and 0.02 nm/hr/edge in section 906 are the rate of changes in an edge position.

These exposure delays are a time period from which the hydrogen silsesquioxane layer is deposited and the time at which the hydrogen silsesquioxane layer is exposed using electron beam lithography. As depicted, in section 904, the time between 30 hours and 75 hours for a 0.002 nm/hr/edge shows a shift in $\Delta w_g$. In section 906, the time between 15 hours and 70 hours shows a shift that is markedly reduced as compared to section 904. As a result, the addition of the diffusion barrier layer can produce at least one of contaminants, aging of the hydrogen silsesquioxane layer, or the effects aging of the hydrogen silsesquioxane layer.

With reference to FIG. 10, an illustration of a graph of exposures of devices as a function of dose and pattern density without proximity effect corrections is depicted in accordance with an illustrative embodiment. As depicted, graph 1000 shows percentage exposures as a function of dose D on y-axis 1002 and pattern density ρ on x-axis 1004.

In graph 1000, onset dose $D_t$ varies with the pattern density. The onset dose $D_t$ is the largest dose for each pattern density above which the percentage of under-exposed features is greater than 50 percent. In graph 1000, corrections for proximity effects have not been performed. As can be seen, the onset dose can vary greatly. As a result, depending on the amount of change that can be performed from the base dose, a subset of features may be misexposed based on potential limitations for modifying or changing the base dose to obtain the onset dose.

In this illustrative example, the base dose is an average dose that is assigned to the entire pattern for a material stack. This base dose can be modulated within a pattern based on the local pattern density at a particular location. In the illustrative example, the amount of modulation set by the local pattern density with each location can be computed by convoluting the pattern with a point spread function that describes how the electron beam loses its energy as a function of radius of the electron beam. For example, a first matrix comprises numbers that have a value of 1 where a pattern is located and a value of 0 where a pattern is not present. A second matrix is defined as the convolution kernel based on the point spread function. The first matrix is overlaid on the second matrix with an offset ($\Delta x$, $\Delta y$). The matrices are multiplied and integrated over the overlapping region. Then the offset of $\Delta x$, $\Delta y$ is used to offset the entire first matrix for the pattern. The result is a matrix as a function of $\Delta x$, $\Delta y$ that provides a dose for each location.

Even with optimized exposure and development procedures in the different examples, performing electron beam lithography can vary depending on pattern density of features. For example, regions with sparse features can require higher exposure doses than areas where the features are denser.

In the illustrative example, an energy point spread function (PSF) can be examined in which the energy point spread functions describes energy from electrons that can extend many beam widths away from the exposure location where the electron beam is directed.

One manner in which this proximity effect can be addressed includes relying on measuring linewidths of dedicated structures. In the illustrative example, a machine learning model (MLM) can be trained to identify onset exposure doses as a function of local pattern densities occurring with different patterns of interest. For example, a machine learning model can be trained for a particular pattern that is to be used in manufacturing various devices such as quantum information processors.

In the illustrative example, the evolution of onset exposure dose Dl with local pattern density ρ is described by:

$$D1(\rho, n) = A \frac{1+\eta}{1+2\rho\eta} \quad (1)$$

where η is the energy ratio of backscattered and forward scattered electrons, ρ is pattern density, and A sets the baseline dose at half filling, i.e. Dl(ρ=50%).

Graph 1000 shows the percentage of underexposed devices as a function of dose D and local pattern density ρ. Experimental onset doses $D_t$, defined as the highest value for which $f_u$<50%, decay rapidly with ρ from 1.30 mC/cm$^2$ at ρ=0.19 to 0.60 mC/cm$^2$ for ρ=0.55. η, which controls the rate of decay and can be determined from experimental data and using from nonlinear regression analyses ($R^2 \geq 0.99$) to be η≅5.

For comparison, Monte Carlo simulations of electron-sample interactions yield η≈0.1;[23] for 500-nm-thick Zeon Electron Beam Positive-tone resist such as ZEP520A series (ZEP) and polymethyl methacrylate, η ranges between 0.6 and 1.1, depending on the substrate material. ZEP is a common resist available from Zeon Specialty Materials, Inc.

and is used in electron beam lithography. In this depicted example, the larger value of η observed in graph 1000 reflects the complex nature of proximity effects in hydrogen silsesquioxane, which involves not only the diffusion and scattering of electrons, but also hydrogen radicals, which modulate cross-linking energy thresholds.

Figure 11:
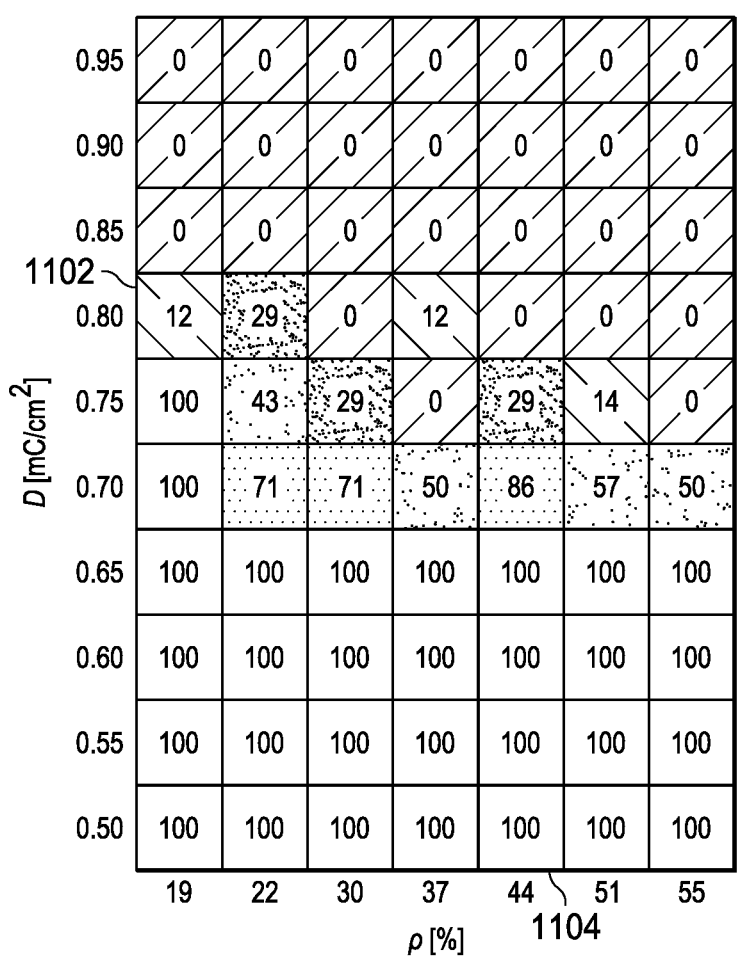
FIG. 11 is an illustration of a graph of exposures of devices as a function dose and pattern density with proximity effect corrections in accordance with an illustrative embodiment.

Turning next to FIG. 11, an illustration of a graph of exposures of devices as a function dose and pattern density with proximity effect corrections is depicted in accordance with an illustrative embodiment. In this illustrative example, graph 1100 shows percentage exposures as a function of dose D on y-axis 1102 and pattern density ρ on x-axis 1104.

In this graph, the results obtained by locally modulating base doses within patterns with a spatially varying dose multiplier that depends on the output of convolutions between computer-aided designs and an η-corrected energy point spread function (PSF). The result in graph 1100 is in contrast to the results obtained for uncorrected exposures as shown in graph 1000 in FIG. 10.

By adjusting onset doses $D_I$ that are constant at $D_I \approx 0.7$ mC/cm2 and independent of pattern density ρ, a span of dissimilar geometries can be patterned concurrently. Thus, proximity effect corrections can be made resulting in the onset dose becoming substantially constant at about 0.7 mC/cm$^2$ in the example shown in graph 1100 in FIG. 11. With these corrections, variability in the onset does may be reduced to increase the ability to accurately pattern features regardless of the local pattern density for the features.

Figure 12:
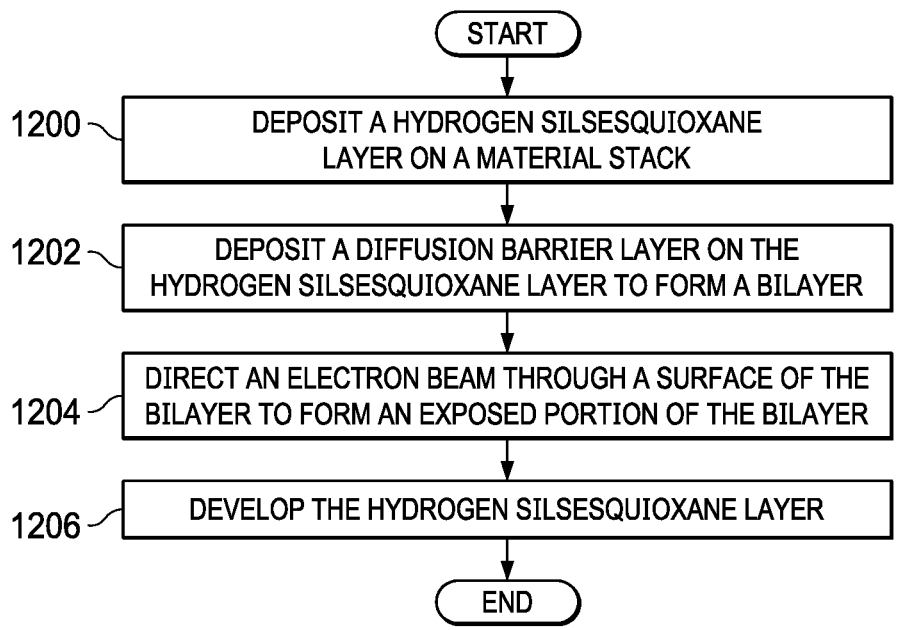
FIG. 12 is an illustration of a flowchart of a process for processing a material stack in accordance with an illustrative embodiment.

Turning next to FIG. 12, an illustration of a flowchart of a process for processing a material stack is depicted in accordance with an illustrative embodiment. The process in FIG. 12 can be implemented in hardware, software, or both. One or more of the different operations can also be performed by human operators operating fabrication equipment, such as semiconductor fabrication equipment. When implemented in software, the process can take the form of program code that is run by one or more processor units located in one or more hardware devices in one or more computer systems. The process can operate to control fabrication equipment to perform one or more of the different operations depicted in this figure.

The process begins by depositing a hydrogen silsesquioxane layer on a material stack (operation 1200). The process deposits a diffusion barrier layer on the hydrogen silsesquioxane layer to form a bilayer (operation 1202). The diffusion barrier layer is comprised of a material having a thickness that increases an amount of time before the hydrogen silsesquioxane layer ages to change a dose in an electron beam needed to expose the hydrogen silsesquioxane layer to obtain a desired width for a selected feature geometry.

The process directs an electron beam through a surface of the bilayer to form an exposed portion of the bilayer (operation 1204). In operation 1204, the electron beam applies the dose in the exposed portion of the bilayer that is selected based on a pattern density of features for the material stack to have a desired level of exposure of the hydrogen silsesquioxane layer for the selected feature geometry. Other portions of the bilayer not exposed to the electron beam form an unexposed portion. Each of exposed portion and unexposed portion of the bilayer may or may not be contiguous. For example, the unexposed portion may have two or more sections that are not contiguous.

The process develops the hydrogen silsesquioxane layer (operation 1206). In operation 1206, the exposed portion of the hydrogen silsesquioxane layer exposed to the electron beam remains on the material stack.

Figure 13:
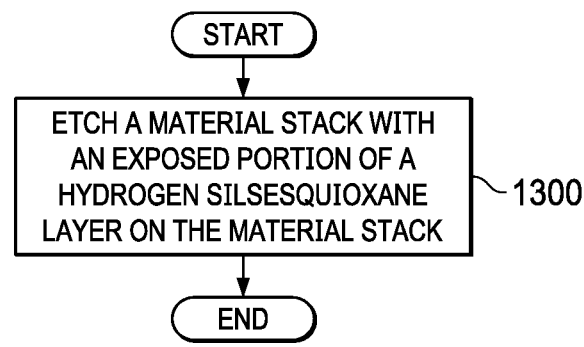
FIG. 13 is an illustration of a flowchart of a process for processing a material stack in accordance with an illustrative embodiment.

Turning now to FIG. 13, an illustration of a flowchart of a process for processing a material stack is depicted in accordance with an illustrative embodiment. The operation illustrated in this flowchart is an operation that can be performed as part of a process depicted in the flowchart in FIG. 12. This operation can be performed after operation 1206 in FIG. 12.

The process etches a material stack with an exposed portion of a hydrogen silsesquioxane layer on the material stack (operation 1300). The process terminates thereafter.

Figure 14:
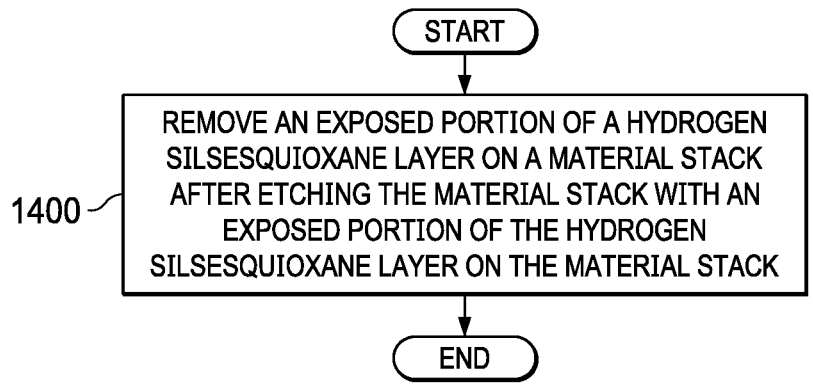
FIG. 14 is an illustration of a flowchart of a process for processing a material stack in accordance with an illustrative embodiment.

In FIG. 14, an illustration of a flowchart of a process for processing a material stack is depicted in accordance with an illustrative embodiment. The operation illustrated in this flowchart is an operation that can be performed as part of a process depicted in the flowchart in FIG. 12. This operation can be performed after operation 1300 in FIG. 13.

The process removes an exposed portion of a hydrogen silsesquioxane layer on a material stack after etching the material stack with the exposed portion of the hydrogen silsesquioxane layer on the material stack (operation 1400). The process terminates thereafter.

Figure 15:
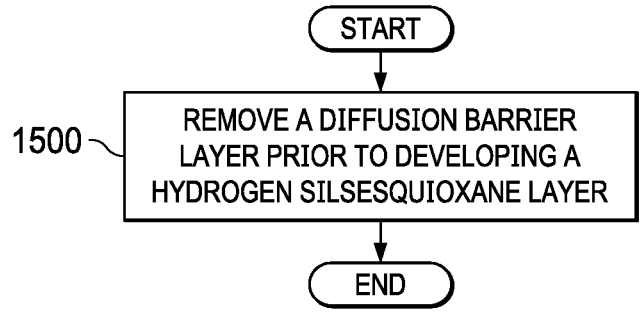
FIG. 15 is an illustration of a flowchart of a process for processing a material stack in accordance with an illustrative embodiment.

Turning to FIG. 15, an illustration of a flowchart of a process for processing a material stack is depicted in accordance with an illustrative embodiment. The operation illustrated in this flowchart is an operation that can be performed as part of a process depicted in the flowchart in FIG. 12. This operation can be performed prior to operation 1206 in FIG. 12 when a developer used does not remove a diffusion barrier layer.

The process removes a diffusion barrier layer prior to developing a hydrogen silsesquioxane layer (operation 1500). In operation 1500, the hydrogen silsesquioxane layer remains on a material stack. The process terminates thereafter.

Figure 16:
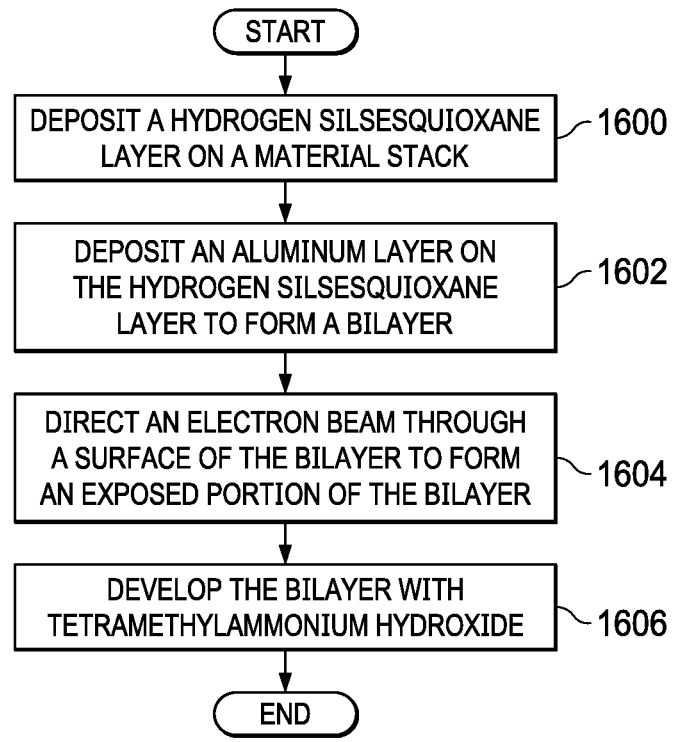
FIG. 16 is an illustration of a flowchart of a process for processing a material stack in accordance with an illustrative embodiment.

With reference next to FIG. 16, an illustration of a flowchart of a process for processing a material stack is depicted in accordance with an illustrative embodiment. The process in FIG. 16 can be implemented in hardware, software, or both. One or more of the different operations can also be performed by human operators operating fabrication equipment, such as semiconductor fabrication equipment. When implemented in software, the process can take the form of program code that is run by one or more processor units located in one or more hardware devices in one or more computer systems. The process can operate to control fabrication equipment to perform one or more of the different operations depicted in this figure.

The process begins by depositing a hydrogen silsesquioxane layer on a material stack (operation 1600). The process deposits an aluminum layer on the hydrogen silsesquioxane layer to form a bilayer (operation 1602).

The process directs an electron beam through a surface of a bilayer to form an exposed portion of the bilayer (operation 1604). The process develops the bilayer with tetramethylammonium hydroxide. (operation 1606). The process terminates thereafter. In operation 1606, the tetramethylammonium hydroxide removes the aluminum layer and an unexposed portion of the hydrogen silsesquioxane layer, leaving the exposed portion of the hydrogen silsesquioxane layer on the material stack.

The material stack with the exposed portion of the hydrogen silsesquioxane layer can be processed using at least one of etching, doping, implantation, or some other operation to form features for a structure using the material stack.

Figure 17:
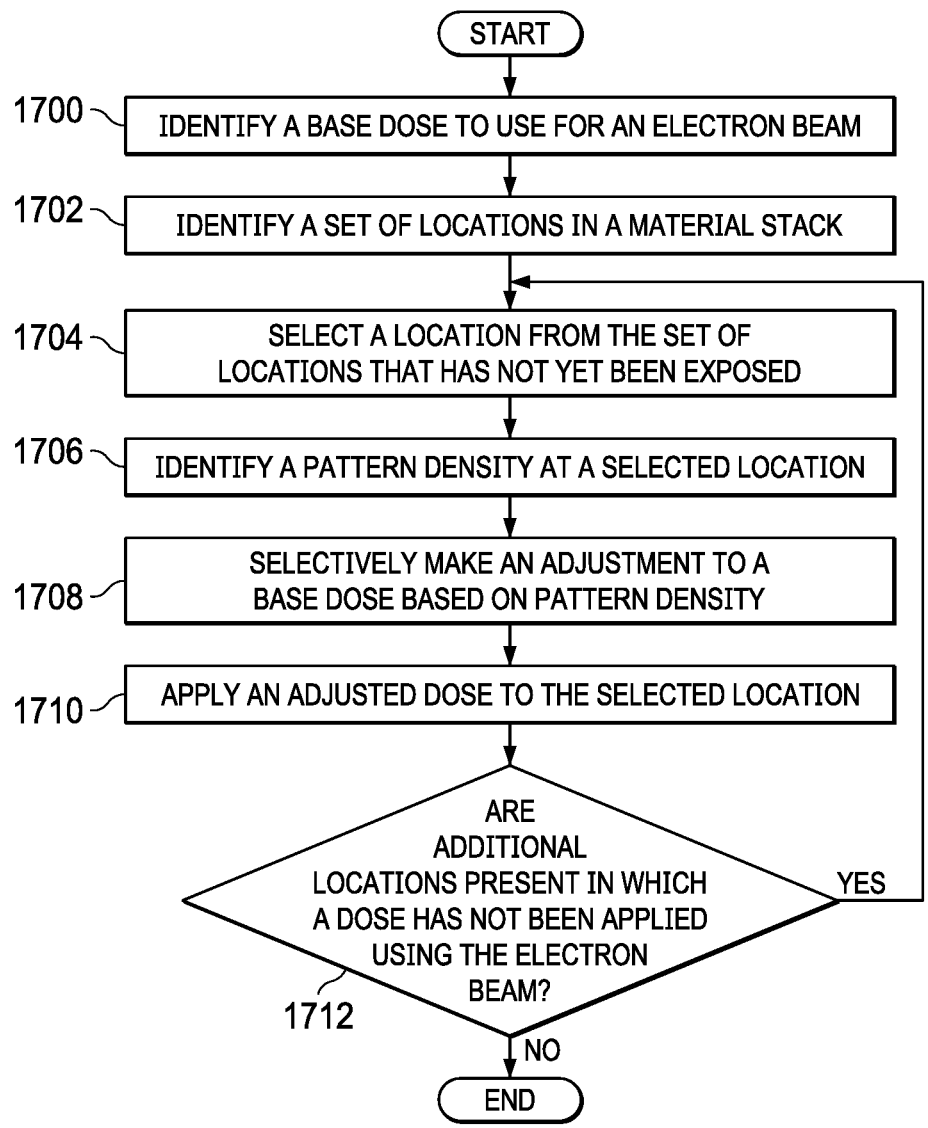
FIG. 17 is an illustration of a flowchart of a process for directing an electron beam through a surface of a bilayer in accordance with an illustrative embodiment.

Turning now to FIG. 17, an illustration of a flowchart of a process for directing an electron beam through a surface of a bilayer is depicted in accordance with an illustrative embodiment. The process illustrated in FIG. 17 is an example of operations that can performed in operation 1204 in FIG. 12 and operation 1604 in FIG. 16.

The process begins by identifying a base dose to use for an electron beam (operation 1700). In operation 1700, a base dose is an average dose that can be applied to a region such as the region encompassed by a material stack. In this illustrative example, the base dose can be the described using a unit of electric charge areal density such as coulomb per centimeter squared ($C/cm^2$). The base dose can be a dose applied to regions with a 50 percent density that results in the features being properly exposed.

The process identifies a set of locations in a material stack (operation 1702). In this illustrative example, each location can be a region on the material stack. A region can have a shape such as a circle, a square, a hexagon, or some other suitable shape. For example, the size of the location can be, for example, three times the backscattering distance. The process selects a location from the set of locations that has not yet been exposed (operation 1704).

The process then identifies a pattern density at a selected location (operation 1706). The process then selectively makes an adjustment to a base dose based on a pattern density (operation 1708). In this illustrative example, the base dose may be adjusted by a multiplier or factor to increase or decrease the base dose based on the density of features in the location. For example, a dose can increase as the density of features decreases. The dose can decrease as the density of the features increases.

Additionally, the adjustment in operation 1708 can also include adjusting characteristics of the electron beam. These adjustments can be made to a point spread function that describes how the energy of the electron beam spread that is a function of radius. This adjustment can be made such that based on the density.

For example, as the density increases, the energy point spread function may be adjusted to control the energy spread of the electron beam. This energy spread can be, for example, how many beam widths away from the exposure site the energy will extend from the electron beam.

Alternatively, a point spread function can be defined that matches that of the electron beam and convolute the point spread function with the pattern density to calculate the dose multiplier and adjust the exposure dose without needing to modify the electron beam.

The process then applies an adjusted dose to the selected location (operation 1710). A determination is made as to whether additional locations are present in which a dose has not been applied using the electron beam (operation 1712). If an additional location is present, the process returns to operation 1704. Otherwise, the process terminates.

As a result, the dose selection in this process can be used to direct an electron beam with a dose that that varies based on a pattern density of features at different locations on the material stack. With the process, the dose can be varied to cause a desired level of exposure of the hydrogen silsesquioxane layer at the different locations.

The flowcharts and block diagrams in the different depicted embodiments illustrate the architecture, functionality, and operation of some possible implementations of apparatuses and methods in an illustrative embodiment. In this regard, each block in the flowcharts or block diagrams can represent at least one of a module, a segment, a function, or a portion of an operation or step. For example, one or more of the blocks can be implemented as program code, hardware, or a combination of the program code and hardware. When implemented in hardware, the hardware can, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams can be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Figure 18:
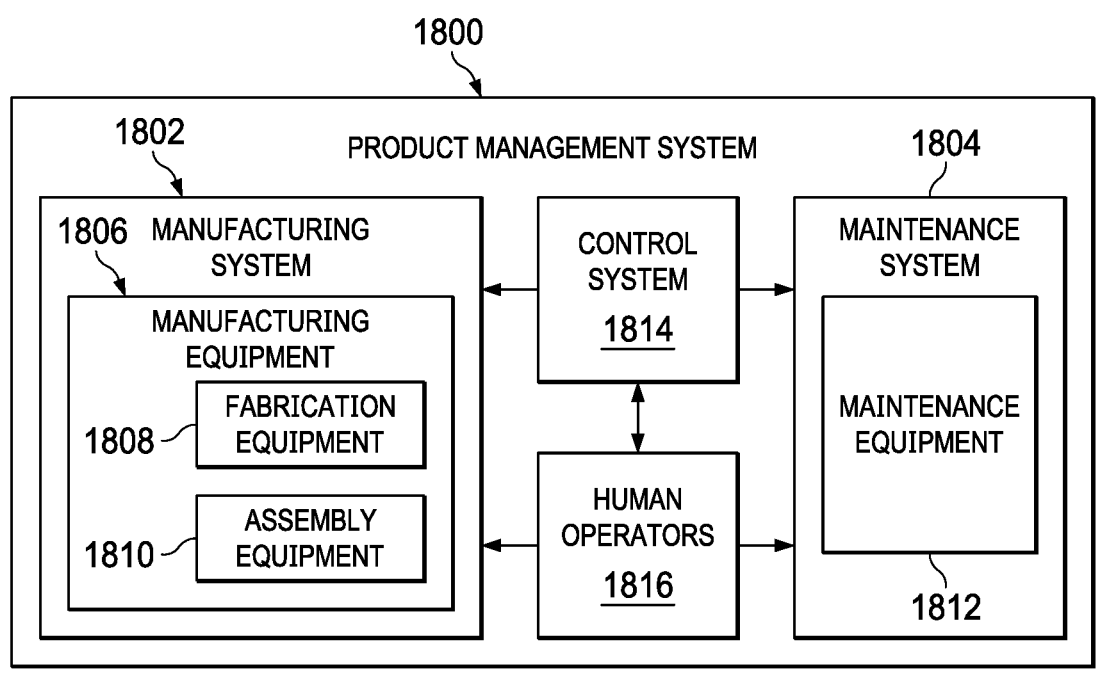
FIG. 18 is an illustration of a block diagram of a product management system in accordance with an illustrative embodiment.

Turning now to FIG. 18, an illustration of a block diagram of a product management system is depicted in accordance with an illustrative embodiment. Product management system 1800 is a physical hardware system. In this illustrative example, product management system 1800 includes at least one of manufacturing system 1802 or maintenance system 1804.

Manufacturing system 1802 is configured to manufacture products such as, for example, such as an aircraft, a spacecraft, a communications system, a micro-electromechanical system, a computer, a chip, quantum devices, integrated circuits, a processor, a quantum bit device, a quantum memory, a photonic device, a superconducting single photon detector, or other suitable products. As depicted, manufacturing system 1802 includes manufacturing equipment 1806. Manufacturing equipment 1806 includes at least one of fabrication equipment 1808 or assembly equipment 1810.

Fabrication equipment 1808 is equipment that used to fabricate components for parts or components for a product. For example, fabrication equipment 1808 can include machines and tools. These machines and tools can be at least one of a drill, a hydraulic press, a furnace, a mold, a composite tape laying machine, a vacuum system, a lathe, or other suitable types of equipment. Fabrication equipment 1808 can be used to fabricate at least one of metal parts, composite parts, semiconductors, circuits, quantum devices, fasteners, ribs, skin panels, spars, antennas, or other suitable types of parts.

For example, fabrication equipment 1808 can include machines and tools. These machines and tools can be at least one of a drill, a hydraulic press, a furnace, a mold, a composite tape laying machine, a vacuum system, a lathe, or other suitable types of equipment.

With respect to fabricating semiconductor components or quantum devices, fabrication equipment 1808 can comprise at least one of an epitaxial reactor, an oxidation system, a diffusion system, an etching machine, a cleaning machine, a bonding machine, a dicing machine, a wafer saw, an ion implantation machine, a physical vapor deposition system, a chemical vapor deposition system, a photolithography system, an electron beam lithography system, a plasma etcher, a die attachment machine, a wire bonder, a die overcoat system, molding equipment, a hermetic sealer, an electrical tester, a burn-in oven, a retention bake oven, a UV erase machine, or other suitable types of equipment that can be used to manufacture quantum devices, semiconductor structures, or other components. The quantum devices, semiconductor structures may be the products or may be components used in the products.

Assembly equipment 1810 is equipment used to assemble parts to form the product. Assembly equipment 1810 also can include machines and tools. These machines and tools may be at least one of a robotic arm, a crawler, a fastener installation system, a rail-based drilling system, or a robot.

In this illustrative example, maintenance system 1804 includes maintenance equipment 1812. Maintenance equipment 1812 can include any equipment needed to perform maintenance on a product. Maintenance equipment 1812 may include tools for performing different operations on parts on a product. These operations can include at least one of disassembling parts, refurbishing parts, inspecting parts, reworking parts, manufacturing replacement parts, or other operations for performing maintenance on the product. These operations can be for routine maintenance, inspections, upgrades, refurbishment, or other types of maintenance operations.

In the illustrative example, maintenance equipment 1812 may include ultrasonic inspection devices, x-ray imaging systems, vision systems, drills, crawlers, and other suitable devices. In some cases, maintenance equipment 1812 can include fabrication equipment 1808, assembly equipment 1810, or both to produce and assemble parts that needed for maintenance.

Product management system 1800 also includes control system 1814. Control system 1814 is a hardware system and may also include software or other types of components. Control system 1814 is configured to control the operation of at least one of manufacturing system 1802 or maintenance system 1804. In particular, control system 1814 can control the operation of at least one of fabrication equipment 1808, assembly equipment 1810, or maintenance equipment 1812. In illustrative, control system 1814 can include instructions are program code to perform different operations as depicted in the flowcharts in FIGS. 12-17.

The hardware in control system 1814 can be implemented using hardware that may include computers, circuits, networks, and other types of equipment. The control may take the form of direct control of manufacturing equipment 1806. For example, robots, computer-controlled machines, and other equipment can be controlled by control system 1814. In other illustrative examples, control system 1814 can manage operations performed by human operators 1816 in manufacturing or performing maintenance a product. For example, control system 1814 can assign tasks, provide instructions, display models, or perform other operations to manage operations performed by human operators 1816. In these illustrative examples, the different steps for performing electron-beam photolithography using a bilayer system as well as other steps in fabricating devices can be implemented in control system 1814 to manage at operations performed by at least one of human operators 1816, fabrication equipment 1808, or assembly equipment 1810 in least one of the manufacturing or maintenance of products.

In the different illustrative examples, human operators 1816 can operate or interact with at least one of manufacturing equipment 1806, maintenance equipment 1812, or control system 1814. This interaction can occur to manufacture semiconductor structures, quantum devices, integrated circuits, printed circuit boards, assemblies, subassemblies, housings, and other components for products.

Thus, the illustrative examples provide a method, apparatus, and system for manufacturing a structure using electron beam lithography with a bilayer resist system. In one illustrative example, a hydrogen silsesquioxane layer is deposited on a material stack. A diffusion barrier layer is deposited on the hydrogen silsesquioxane layer to form a bilayer. The diffusion barrier layer is comprised of a material having a thickness that increases an amount of time before the hydrogen silsesquioxane layer ages to change a dose, applied by an electron beam, needed to expose the hydrogen silsesquioxane layer for a selected feature geometry with a desired width. The electron beam is directed through a surface of the bilayer to form an exposed portion of the bilayer. The electron beam applies the dose in the exposed portion of the bilayer that is selected based on a pattern density of features for the material stack to have a desired level of exposure of the hydrogen silsesquioxane layer for the selected feature geometry. The hydrogen silsesquioxane layer is developed. The exposed portion of the hydrogen silsesquioxane layer exposed to the electron beam remains on the material stack.

In the illustrative examples, a negative tone electron beam lithography process has been described to fabricate structures from serial stacks. The structures include, for example, nanoscale electronic and quantum devices. In the illustrative examples, a diffusion barrier layer is used in combination with a hydrogen silsesquioxane layer in a manner that reduces issues from aging of the hydrogen silsesquioxane layer. In other words, the amount of time available for performing electron beam lithography increases as compared to current techniques.

In one illustrative example, a metal-capped hydrogen silsesquioxane (HSQ) bilayer resist system is used with an optimized proximity-corrected exposure and a tetramethyl ammonium hydroxide (TMAH) development process. The metal can be, for example, an aluminum deposited on a hydrogen silsesquioxane layer to form the bilayer. This process can enable meeting geometric tolerances at levels such as at 10 nm. Further, with this bilayer, the increased time for processing windows can be larger.

Additionally, in the illustrative example, the dose from the electron beam can be controlled in a manner that reduces issues from proximity effects. In one illustrative example, the point spread function is controlled to reduce these effects to enable a decrease variability in an onset dose as compared to the base for correcting the electron beam to pattern features in a hydrogen silsesquioxane layer. As a result, quantum devices including quantum dot qubits can be fabricated with greater yields and efficiency. Additionally, in the illustrative examples using tetramethyl ammonium hydroxide (TMAH) as a developer, issues associated with mobile contaminants associated with sodium-based developers can be reduced or avoided. Further, when tetramethyl ammonium hydroxide (TMAH) is used with aluminum as a diffusion barrier layer, this developer can also remove the diffusion barrier layer as part of the developing process for the hydrogen silsesquioxane layer.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component can be configured to perform the action or operation described. For example, the component can have a configuration or design for a structure that provides the component an ability to perform the action or operation that is described in the illustrative examples as being performed by the component. Further, to the extent that terms "includes", "including", "has", "contains", and variants thereof are used herein, such terms are intended to be inclusive in a manner similar to the term "comprises" as an open transition word without precluding any additional or other elements.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for processing a material stack, the method comprising:
   depositing a hydrogen silsesquioxane layer on the material stack;
   depositing an aluminum layer on the hydrogen silsesquioxane layer to form a bilayer;
   directing an electron beam through a surface of the bilayer to form an exposed portion of the bilayer, wherein an energy spread of the electron beam is controlled by adjusting an η corrected energy point spread function according to an onset exposure dose Dl described by:

$$Dl(\rho,\eta)=A1+\eta/1+2\rho\eta$$

where η is an energy ratio of backscattered and forward scattered electrons, ρ is a local pattern density %, and A sets a baseline dose at half filling where ρ=50%; and
   developing the bilayer with tetramethylammonium hydroxide, wherein the tetramethylammonium hydroxide removes the aluminum layer and an unexposed portion of the hydrogen silsesquioxane layer, leaving the exposed portion of the hydrogen silsesquioxane layer on the material stack.

2. The method of claim 1 further comprising:
   etching the material stack with the exposed portion of the hydrogen silsesquioxane layer on the material stack.

3. The method of claim 2 further comprising:
   removing the exposed portion of the hydrogen silsesquioxane layer from the material stack after etching the material stack with the exposed portion of the hydrogen silsesquioxane layer.

4. The method of claim 1, wherein the electron beam is directed to apply a dose that is selected based on a pattern density of features for the material stack to have a desired level of exposure of the hydrogen silsesquioxane layer.

5. The method of claim 1, wherein the electron beam has a dose that varies based on a pattern density of features at different locations on the material stack, wherein the dose is varied to cause a desired level of exposure of the hydrogen silsesquioxane layer at the different locations.

6. The method of claim 5, wherein the features are selected from at least one of a gate, a lead, or a line.

7. The method of claim 1, wherein the aluminum layer has a thickness selected to increase an amount of time before the hydrogen silsesquioxane layer ages to change a dose in the electron beam needed to expose the hydrogen silsesquioxane layer to obtain a desired width for a selected feature geometry.

8. The method of claim 1, wherein the material stack is selected from at least one of a substrate or a set of layers on the substrate.

9. The method of claim 1, wherein the hydrogen silsesquioxane layer is about 20 nm to about 100 nm thick.

10. The method of claim 1, wherein the aluminum layer is about 5 nm to 50 nm thick.

11. The method of claim 1, wherein processing of the material stack forms a set of structures selected from at least one of a quantum bit, a quantum dot qubit, a waveguide, an optical waveguide, an optical resonator, a photon emitting quantum memory, and a transistor.

12. A method for processing a material stack, the method comprising:
    depositing a hydrogen silsesquioxane layer on the material stack;
    depositing a diffusion barrier layer on the hydrogen silsesquioxane layer to form a bilayer, wherein the diffusion barrier layer is comprised of a material having a thickness that increases an amount of time before the hydrogen silsesquioxane layer ages to change a dose in an electron beam needed to expose the hydrogen silsesquioxane layer to obtain a desired width for a selected feature geometry;
    directing the electron beam through a surface of the bilayer to form an exposed portion of the bilayer, wherein the electron beam applies the dose in the exposed portion of the bilayer that is selected based on a pattern density of features for the material stack to have a desired level of exposure of the hydrogen silsesquioxane layer for the selected feature geometry, wherein an energy spread of the electron beam is controlled by adjusting an η corrected energy point spread function according to an onset exposure dose Dl described by:

$$Dl(\rho,\eta)=A1+\eta/1+2\rho\eta$$

where η is an energy ratio of backscattered and forward scattered electrons, ρ is a local pattern density %, and A sets a baseline dose at half filling where ρ=50%; and
    developing the hydrogen silsesquioxane layer, wherein the exposed portion of the hydrogen silsesquioxane layer exposed to the electron beam remains on the material stack.

13. The method of claim 12 further comprising:
    etching the material stack with the exposed portion of the hydrogen silsesquioxane layer on the material stack.

14. The method of claim 13 further comprising:
    removing the exposed portion of the hydrogen silsesquioxane layer on the material stack after etching the material stack with the exposed portion of the hydrogen silsesquioxane layer on the material stack.

15. The method of claim 12, wherein a developer used to develop the hydrogen silsesquioxane layer also removes the diffusion barrier layer, and wherein developing the hydrogen silsesquioxane layer wherein the exposed portion of the hydrogen silsesquioxane layer exposed to the electron beam remains on the material stack comprises:
    developing the hydrogen silsesquioxane layer using the developer, wherein the diffusion barrier layer and an unexposed portion of the hydrogen silsesquioxane layer are removed and the exposed portion of the hydrogen silsesquioxane layer exposed to the electron beam remains on the material stack.

16. The method of claim 15, wherein the diffusion barrier layer is aluminum and the developer is tetramethylammonium hydroxide.

17. The method of claim 12 further comprising:
    removing the diffusion barrier layer prior to developing the hydrogen silsesquioxane layer, wherein the hydrogen silsesquioxane layer remains on the material stack.

18. The method of claim 12, wherein the electron beam is directed to apply a dose that is selected based on the pattern density of features for the material stack to have a desired level of exposure of the hydrogen silsesquioxane layer.

19. The method of claim 12, wherein the electron beam has a dose that varies based on the pattern density of features at different locations on the material stack, wherein the dose is varied to cause the desired level of exposure of the hydrogen silsesquioxane layer at the different locations.

20. The method of claim 12, wherein the material in the diffusion barrier layer and a thickness of the diffusion barrier layer is selected to increase an amount of time before the hydrogen silsesquioxane layer ages to change a dose in the electron beam needed to expose the hydrogen silsesquioxane layer, and wherein the thickness of the diffusion barrier layer is selected to decrease scattering of the electron beam to obtain a desired width for a selected feature geometry.

21. The method of claim 12, wherein the material for the diffusion barrier layer is selected from at least one of aluminum, aluminum oxide, or titanium.

22. The method of claim 12, wherein the material stack is selected from at least one of a substrate or a set of layers on the substrate.

23. The method of claim 12, wherein processing of the material stack forms a set of structures selected from at least one of a quantum bit, a quantum dot qubit, a waveguide, an optical waveguide, an optical resonator, a photon emitting quantum memory, and a transistor.

24. A method for processing a material stack, the method comprising:

depositing a hydrogen silsesquioxane layer on the material stack;

depositing an aluminum layer on the hydrogen silsesquioxane layer to form a bilayer;

directing an electron beam through a surface of the bilayer to form an exposed portion of the bilayer, wherein an energy spread of the electron beam is controlled by adjusting an η corrected energy point spread function according to an onset exposure dose D1 described by:

$$D1(\rho, \eta) = A\frac{1+\eta}{1+2\rho\eta}$$

where η is an energy ratio of backscattered and forward scattered electrons, ρ is a local pattern density %, and A sets a baseline dose at half filling where ρ=50%; and developing the bilayer with tetramethylammonium hydroxide, wherein the tetramethylammonium hydroxide removes the aluminum layer and an unexposed portion of the hydrogen silsesquioxane layer, leaving the exposed portion of the hydrogen silsesquioxane layer on the material stack, wherein processing of the material stack forms a quantum dot qubit.

* * * * *

UNITED STATES PATENT AND TRADEMARK OFFICE
CERTIFICATE OF CORRECTION

PATENT NO. : 12,248,248 B2
APPLICATION NO. : 17/452198
DATED : March 11, 2025
INVENTOR(S) : Mei et al.

Page 1 of 1

It is certified that error appears in the above-identified patent and that said Letters Patent is hereby corrected as shown below:

In the Claims

Column 17, Line 24, correct "Dl($\rho,\eta$)=A1+ $\eta$ /1+2 $\rho\eta$" to read -- $D1(\rho,\eta) = A\frac{1+\eta}{1+2\,\rho\eta}$ --

Column 18, Line 29, correct "Dl($\rho,\eta$)=A1+ $\eta$ /1+2 $\rho\eta$" to read -- $D1(\rho,\eta) = A\frac{1+\eta}{1+2\,\rho\eta}$ --

Signed and Sealed this
Fifteenth Day of April, 2025

Coke Morgan Stewart
*Acting Director of the United States Patent and Trademark Office*